United States Patent
Meng et al.

(10) Patent No.: US 11,211,261 B2
(45) Date of Patent: Dec. 28, 2021

(54) PACKAGE STRUCTURES AND METHODS FOR FORMING THE SAME

(71) Applicant: Taiwan Semiconductor Manufacturing Company, Ltd., Hsinchu (TW)

(72) Inventors: Hsien-Liang Meng, Hsinchu (TW); Wei-Hung Lin, Xinfeng Township (TW); Yu-min Liang, Zhongli (TW); Ming-Che Ho, Tainan (TW); Hung-Jui Kuo, Hsinchu (TW); Chung-Shi Liu, Hsinchu (TW); Mirng-Ji Lii, Sinpu Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 215 days.

(21) Appl. No.: 16/056,689

(22) Filed: Aug. 7, 2018

(65) Prior Publication Data
US 2018/0342404 A1 Nov. 29, 2018

Related U.S. Application Data

(63) Continuation of application No. 15/157,752, filed on May 18, 2016, now Pat. No. 10,049,894, which is a
(Continued)

(51) Int. Cl.
*H01L 21/48* (2006.01)
*H01L 23/31* (2006.01)
(Continued)

(52) U.S. Cl.
CPC ........ *H01L 21/4857* (2013.01); *H01L 21/486* (2013.01); *H01L 21/561* (2013.01);
(Continued)

(58) Field of Classification Search
CPC ..... H01L 21/7806; H01L 21/78; H01L 21/77; H01L 21/70; H01L 23/562
See application file for complete search history.

(56) References Cited

U.S. PATENT DOCUMENTS 6,010,951 A 1/2000 Pushpala et al.
7,422,930 B2 9/2008 Thomas et al.
(Continued)

FOREIGN PATENT DOCUMENTS

CN 101355845 A 1/2009
JP 2012186270 A 9/2012

*Primary Examiner* — Brigitte A Paterson
(74) *Attorney, Agent, or Firm* — Slater Matsil, LLP

(57) ABSTRACT

A packaging structure and a method of forming a packaging structure are provided. The packaging structure, such as an interposer, is formed by optionally bonding two carrier substrates together and simultaneously processing two carrier substrates. The processing includes forming a sacrificial layer over the carrier substrates. Openings are formed in the sacrificial layers and pillars are formed in the openings. Substrates are attached to the sacrificial layer. Redistribution lines may be formed on an opposing side of the substrates and vias may be formed to provide electrical contacts to the pillars. A debond process may be performed to separate the carrier substrates. Integrated circuit dies may be attached to one side of the redistribution lines and the sacrificial layer is removed.

20 Claims, 7 Drawing Sheets

Related U.S. Application Data continuation of application No. 13/788,135, filed on Mar. 7, 2013, now Pat. No. 9,362,236.

(51) Int. Cl.
  *H01L 23/498* (2006.01)
  *H01L 21/683* (2006.01)
  *H01L 21/56* (2006.01)
  *H01L 23/538* (2006.01)
  *H01L 21/78* (2006.01)
  *H01L 23/00* (2006.01)
  *H01L 25/18* (2006.01)

(52) U.S. Cl.
  CPC .......... *H01L 21/563* (2013.01); *H01L 21/568* (2013.01); *H01L 21/6835* (2013.01); *H01L 21/7806* (2013.01); *H01L 23/3128* (2013.01); *H01L 23/49811* (2013.01); *H01L 23/5383* (2013.01); *H01L 23/562* (2013.01); *H01L 23/49816* (2013.01); *H01L 24/13* (2013.01); *H01L 24/16* (2013.01); *H01L 24/29* (2013.01); *H01L 24/32* (2013.01); *H01L 24/73* (2013.01); *H01L 24/81* (2013.01); *H01L 24/92* (2013.01); *H01L 25/18* (2013.01); *H01L 2221/68345* (2013.01); *H01L 2224/13101* (2013.01); *H01L 2224/13124* (2013.01); *H01L 2224/13139* (2013.01); *H01L 2224/13144* (2013.01); *H01L 2224/13155* (2013.01); *H01L 2224/13184* (2013.01); *H01L 2224/16225* (2013.01); *H01L 2224/2919* (2013.01); *H01L 2224/32225* (2013.01); *H01L 2224/73204* (2013.01); *H01L 2224/81005* (2013.01); *H01L 2224/81805* (2013.01); *H01L 2224/92125* (2013.01); *H01L 2924/00012* (2013.01); *H01L 2924/01322* (2013.01); *H01L 2924/12042* (2013.01); *H01L 2924/15311* (2013.01); *H01L 2924/18161* (2013.01)

(56) References Cited

U.S. PATENT DOCUMENTS

| | | | |
|---|---|---|---|
| 2004/0140538 A1 | 7/2004 | Harvey | |
| 2005/0194674 A1* | 9/2005 | Thomas | H01L 25/0657 257/690 |
| 2006/0102384 A1* | 5/2006 | Watanabe | H01L 23/49816 174/256 |
| 2006/0121719 A1* | 6/2006 | Nakamura | H01L 24/97 438/613 |
| 2006/0214294 A1 | 9/2006 | Fukasawa | |
| 2006/0286822 A1 | 12/2006 | Thomas et al. | |
| 2008/0295329 A1* | 12/2008 | Muthukumar | H01L 23/481 29/840 |
| 2009/0075428 A1 | 3/2009 | Tang et al. | |
| 2009/0224391 A1 | 9/2009 | Lin et al. | |
| 2011/0095418 A1 | 4/2011 | Lim et al. | |
| 2011/0215480 A1* | 9/2011 | Gorczyca | H01L 23/4985 257/774 |
| 2012/0175157 A1* | 7/2012 | Kaneko | H01L 21/6835 174/257 |
| 2012/0175732 A1* | 7/2012 | Lin | H01L 25/50 257/531 |
| 2012/0211892 A1 | 8/2012 | Kim et al. | |
| 2012/0313190 A1 | 12/2012 | Goel et al. | |
| 2013/0062761 A1 | 3/2013 | Lin et al. | |
| 2013/0277829 A1 | 10/2013 | Yee et al. | |
| 2014/0049932 A1 | 2/2014 | Camarota et al. | |
| 2014/0177193 A1* | 6/2014 | Jin | H01L 23/5389 361/764 |

* cited by examiner

PACKAGE STRUCTURES AND METHODS FOR FORMING THE SAME

This application is a continuation of U.S. patent application Ser. No. 15/157,752, filed on May 18, 2016, now U.S. Pat. No. 10,049,894, entitled "Package Structures and Methods for Forming the Same," which is a continuation of U.S. patent application Ser. No. 13/788,135, filed on Mar. 7, 2013, entitled "Package Structures and Methods for Forming the Same," now U.S. Pat. No. 9,362,236, each application is hereby incorporated herein by reference in its entirety.

BACKGROUND

The fabrication of modern integrated circuits typically involves several steps. Integrated circuits are first fabricated on a semiconductor wafer, which contains multiple duplicated semiconductor chips, each comprising integrated circuits therein. The semiconductor chips are then sawed from the wafer and packaged. The packaging processes have two main purposes: to protect delicate semiconductor chips and to connect interior integrated circuits to exterior pins.

In conventional packaging processes, a semiconductor chip may be mounted on a package component using flip-chip bonding. An underfill is dispensed into the gap between the semiconductor chip and the package component to prevent cracks from being formed in solder bumps or solder balls, wherein cracks are typically caused by thermal stresses. The package component may be an interposer that includes metal connections for routing electrical signals between opposite sides. The chip may be bonded to the interposer through direct metal bonding, solder bonding, or the like.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A package structure and the method of forming the same are provided in accordance with various embodiments. The intermediate stages of forming the package structure are illustrated. The variations of the embodiments are discussed. Throughout the various views and illustrative embodiments, like reference numbers are used to designate like elements.

The following description describes a process of forming a substrate that may be used as an interposer. The process is described in the context of using carrier substrates bonded to each other and processing both sides. The opposing sides of the bonded carrier substrates by using dual-side processing techniques (wherein the substrates are suspended and the opposing sides are processed simultaneously) or in sequence (wherein one side of the substrate is processed and substrate is flipped to process the other side). In some embodiments, it may be desirable to protect one side while processing the other side. The carrier substrates are then debonded. Such embodiments as these may allow greater efficiencies and reduce warpage during processing. Other embodiments, however, may utilize a single carrier substrate and/or processing of a single side.

Figure 1:
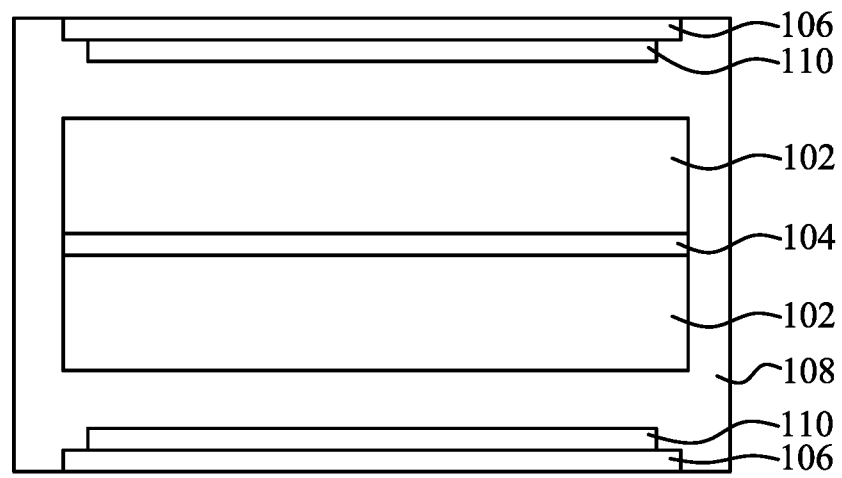
FIGS. 1-9 are cross-sectional views of intermediate stages in the manufacturing of a package in accordance with various embodiments.

Referring first to FIG. 1, there are shown carrier substrates 102 bonded together using an adhesive layer 104 in accordance with an embodiment. Generally, the carrier substrate 102 provides temporary mechanical and structural support during subsequent processing steps, such as those described in greater detail below. The carrier substrate 102 may comprise, for example, glass, silicon oxide, aluminum oxide, a combination thereof, and/or the like. The first adhesive layer 104 may be any suitable adhesive, such as ultraviolet (UV) glue, which loses its adhesive property when exposed to UV lights, and may be applied via lamination, spin coating, or other suitable techniques.

A conductive foil 106 is attached to the bonded carrier substrates 102. As explained in greater detail below, the conductive foil 106 will act as a seed layer for forming conductive vias. In an embodiment, the conductive foil 106 may be, for example, one or more thin layers of Ti, Cu, Ta, TiN, TaN, combinations thereof. The conductive foil 106 may be pre-formed and pressed onto a coating formed over the bonded carrier substrates 102. For example, in the embodiment illustrated in FIG. 1, a coating layer 108 is formed over the bonded carrier substrates 102. The coating layer may be, for example, a pre-preg material molded and pressed on the bonded carrier substrates 102. For example, a pre-preg material with a structure of a B-stage resin, e.g., a limited reaction between resin and hardener has been allowed to occur, coated on glass fiber. The material is laminated on the bonded carrier substrates 102 using heat and/or pressure. In this embodiment, the coating layer 108 may have a thickness from about 25 μm to about 80 μm.

In other embodiments, the coating layer 108 may be an Ajinimoto buildup film (ABF) or the like. The conductive foil 106 may be attached to the coating layer 108 using a second adhesive layer 110, which may be any suitable adhesive, such as ultraviolet (UV) glue, which loses its adhesive property when exposed to UV lights, and may be applied via lamination, spin coating, or other suitable techniques.

In other embodiments, the conductive foil 106 may be formed by depositing a thin conductive layer, such as one or more thin layers of Ti, Cu, Ta, TiN, TaN, combinations thereof, or the like, using CVD, PVD, lamination, hot press, or the like techniques. In this embodiment, the second adhesive layer 110 may be applied to the coating layer 108 and the conductive foil 106 may be deposited onto the adhesive layer 104.

Figure 2:
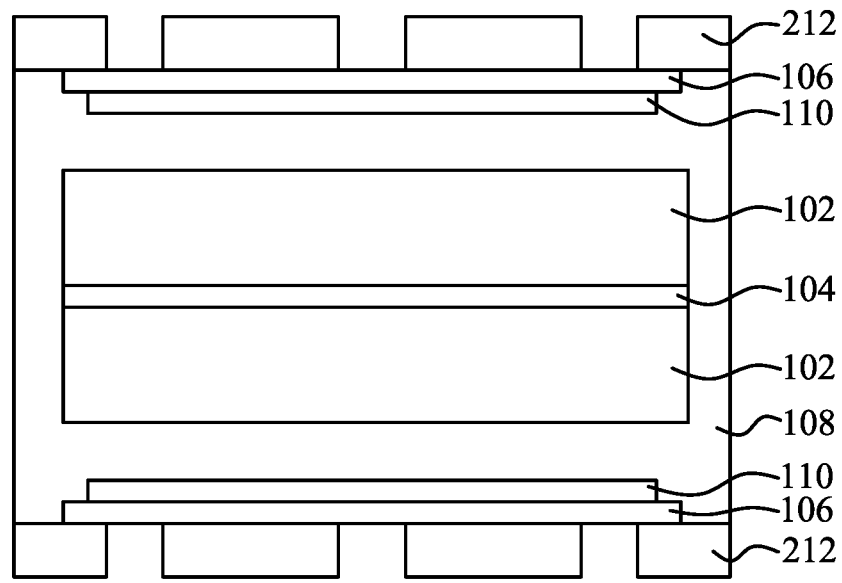

FIG. 2 illustrates a sacrificial layer 212 formed and patterned over the conductive foil 106 in accordance with an embodiment. As will be explained in greater detail below, the sacrificial layer 212 is patterned to accept a conductive material, formed in a subsequent fabrication step, to form conductive pillars. As such, the pattern of the sacrificial layer 212 corresponds to a pattern of external electrical connections for an interposer, and accordingly, a thickness of the sacrificial layer 212 may correspond to desired height of the subsequently formed conductive pillars. In an embodiment, the sacrificial layer 212 may have a thickness from about 30 μm to about 70 μm, though other thicknesses may be used. The sacrificial layer 212 may be formed of, for example, a polybenzoxazole (PBO), polyimde, a solder resist, a polymer-based material, or the like, by coating, lamination, or the like.

Figure 3:
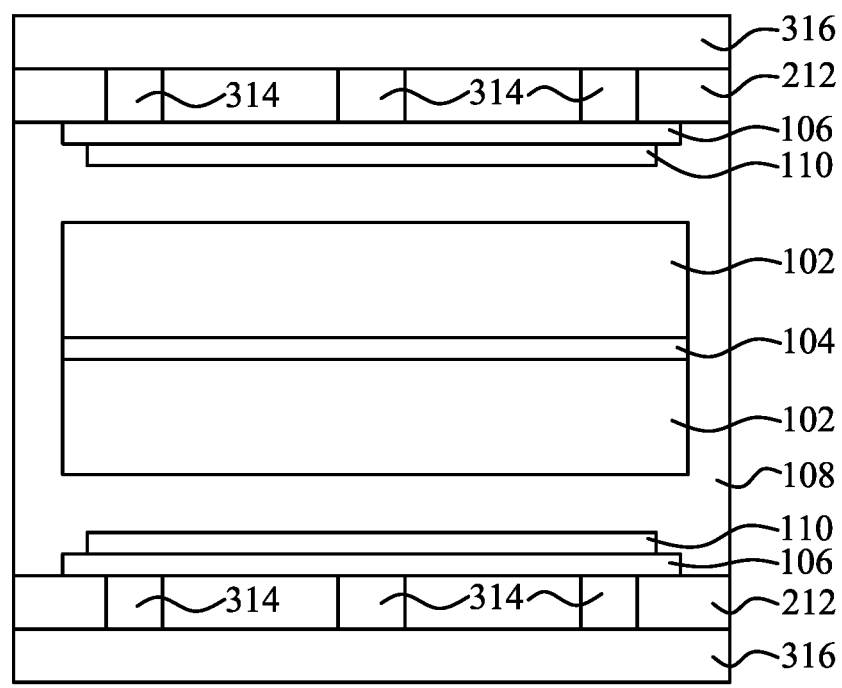

FIG. 3 illustrates the formation of pillars 314 in accordance with an embodiment. The pillars 314 may be formed of any suitable conductive material, including Cu, Ni, Pt, Al, combinations thereof, or the like, and may be formed through any number of suitable techniques, including electroplating, PVD, CVD, electrochemical deposition (ECD), and the like. It should be noted that in some embodiments, such as those that deposit a conformal layer over the entire surface of the wafer (e.g., PVD and CVD), it may be desirable to perform an etching or planarization process (e.g., a chemical mechanical polishing (CMP)) to remove excess conductive material from the surface of the sacrificial layer 212.

Thereafter, substrates 316 may be attached on opposing sides of the structure as illustrated in FIG. 3. As explained below, the substrates 316 will form the substrate of, for example, an interposer. In an embodiment, the substrates 316 may comprise one or more layers of a pre-preg material laminated onto the structure using, for example, heat, pressure, adhesives, combinations thereof, or the like. Other dielectric materials, such as ABF, glass, silicon oxide, aluminum oxide, a combination thereof, and/or the like, may also be used.

Figure 4:
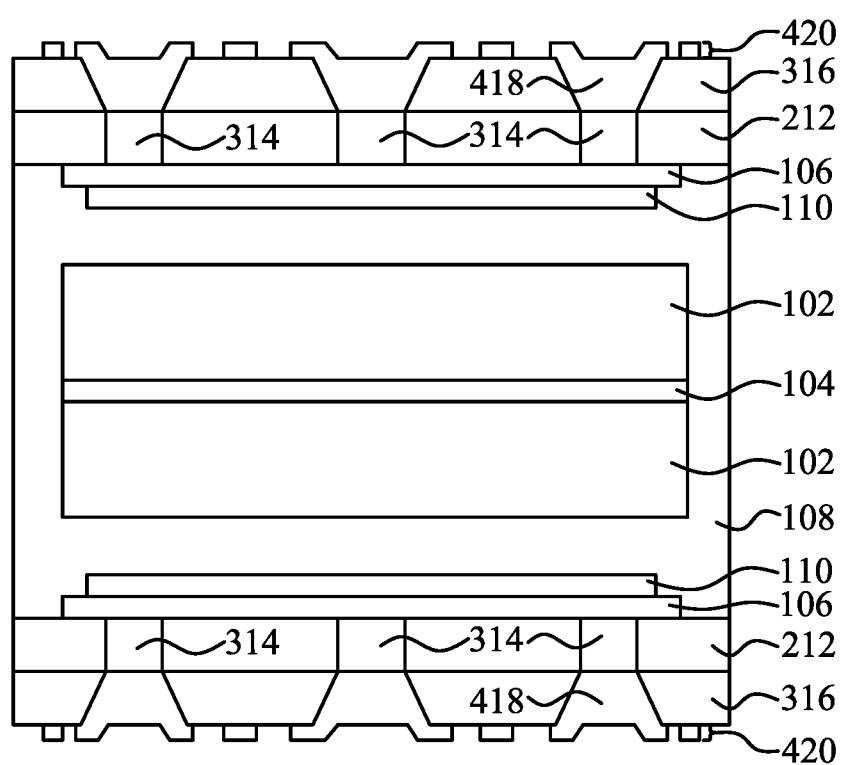

Referring next to FIG. 4, through vias 418 are formed through the substrates 316 in accordance with an embodiment. The through vias 418 provide an electrical connection between opposing sides of the substrate 316. In an embodiment, the through vias 418 are formed by depositing and patterning a mask (e.g., a photoresist mask, hard mask, or the like, not shown) using photolithography techniques. An etch process is utilized to remove exposed portions of the substrates 316, thereby exposing portions of the pillars 314.

The openings are then filled with a conductive material, forming the through vias 418 as illustrated in FIG. 4. The through vias 418 may be formed of any suitable conductive material, including Cu, Ni, Pt, Al, combinations thereof, or the like, and may be formed through any number of suitable techniques, including electroplating, PVD, CVD, ECD, molecular beam epitaxy (MBE), and the like. It should be noted that in some embodiments, such as those that deposit a conformal layer over the entire surface of the wafer (e.g., PVD and CVD), it may be desirable to perform an etching or planarization process (e.g., a CMP) to remove excess conductive material from the surface of the substrates 316.

FIG. 4 also illustrates a post-passivation interconnect (PPI) process to form a first RDL 420 in accordance with an embodiment. The first RDL 420 may be formed to extend along a surface of the substrates 316, acting as a first redistribution layer to route electrical connections from the through vias to a desired location. In an embodiment the first RDL 420 is formed by initially forming a seed layer (not shown) of Ti, Cu, Ta, TiN, TaN, combinations thereof, or the like through a suitable formation process such as CVD, PVD, or sputtering. A photoresist (not shown) may then be formed to cover the seed layer, and the photoresist may then be patterned to expose those portions of the seed layer that are located where the first RDL 420 is desired to be located. Once the photoresist has been formed and patterned, a conductive material, such as Cu, Ni, Pt, Al, AlCu, Au, or combinations thereof, is formed on the seed layer through a deposition process such as plating. However, while the material and methods discussed are suitable to form the conductive material, these materials and processes are merely exemplary.

Once the conductive material has been formed, the photoresist may be removed through a suitable removal process such as ashing. Additionally, after the removal of the photoresist, those portions of the seed layer that were covered by the photoresist may be removed through, for example, a suitable etch process using the conductive material as a mask.

Figure 5:
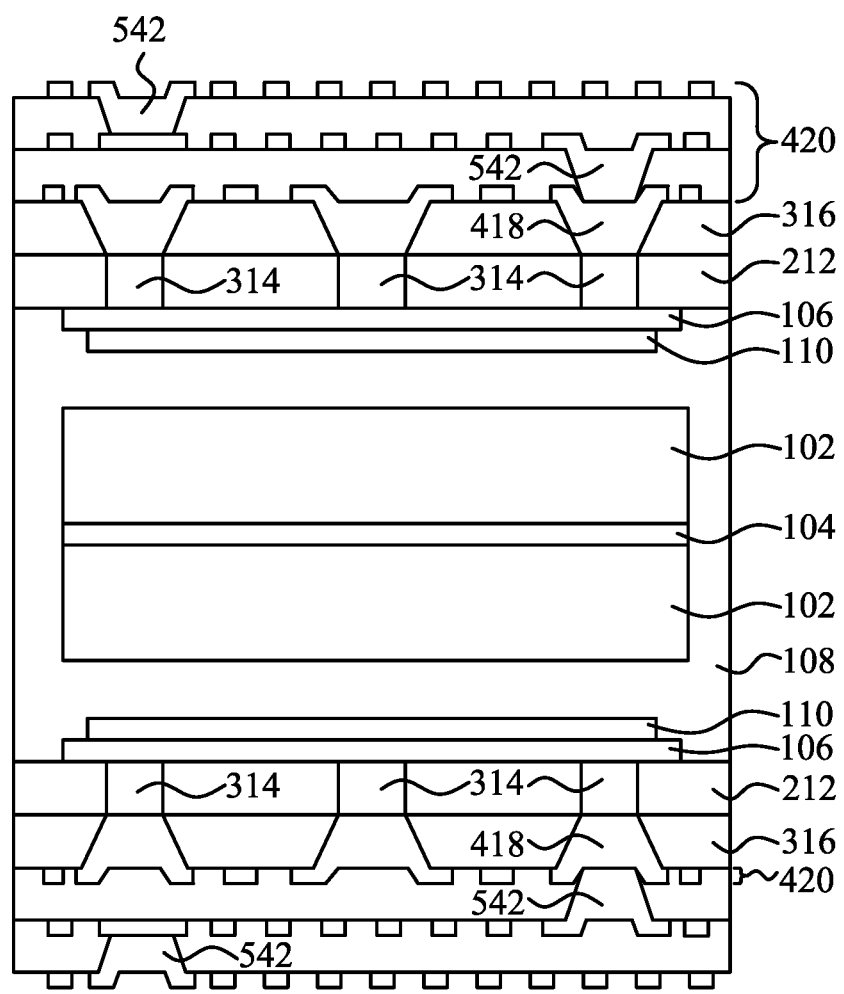

Embodiments may utilize one or more RDLs. For example, FIG. 5 illustrates an embodiment in which three RDLs are utilized separated by a dielectric layer, such as a polybenzoxazole (PBO), polyimide, a solder resist, a polymer-based material, or the like. Adjacent RDLs may be interconnected using vias extending through the dielectric layers, such as vias 524.

Figure 6:
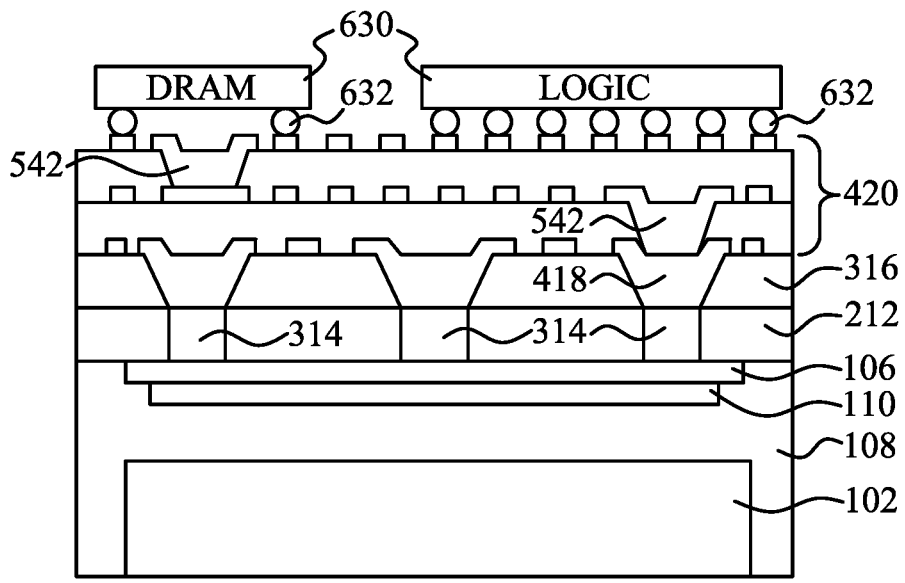

FIG. 6 illustrates a debonding process and a die attach process in accordance with an embodiment. The debonding process separates the two bonded carrier substrates 102. In an embodiment in which the bonded carrier substrates 102 are bonded using a UV-sensitive adhesive, the debonding process may include an exposure to UV light, thereby causing the first adhesive layer 104 to lose its adhesive property and separate the carrier substrates. A clean process may be used to remove excess residue from the adhesive.

The die attach process may be utilized to attach one or more integrated circuit dies. The integrated circuit dies 630 may be any suitable integrated circuit die for a particular application. For example, the integrated circuit dies 630 may be a memory chip, such as a DRAM, SRAM, NVRAM, and/or the like, a logic circuit, or the like. It should be noted that the integrated circuit dies 630 may be the same or different. For example, FIG. 6 illustrates an embodiment in which the integrated circuit dies 630 includes DRAM and logic dies. As explained below, the combination of a DRAM die and a logic die will be packaged together into a single package. In other embodiments, all of the integrated circuit dies 630 are the same, such as multiple memory dies. Other configurations may also be used.

The integrated circuit dies 630 may be bonded to the upper RDL 420 using electrical connections 632. The electrical connections 632 may include a conductive bump, such as a C4 solder bump or micro bump, which may be formed of a eutectic solder, lead free solder, or the like. In some embodiments, the electrical connections 632 may include conductive pillars, under bump metallurgy (UBM), and/or the like. The electrical connectors 632 may be solder balls, metal pads, metal pillars, and/or combinations thereof, and may be formed of gold, silver, nickel, tungsten, aluminum, and/or alloys thereof.

Figure 7:
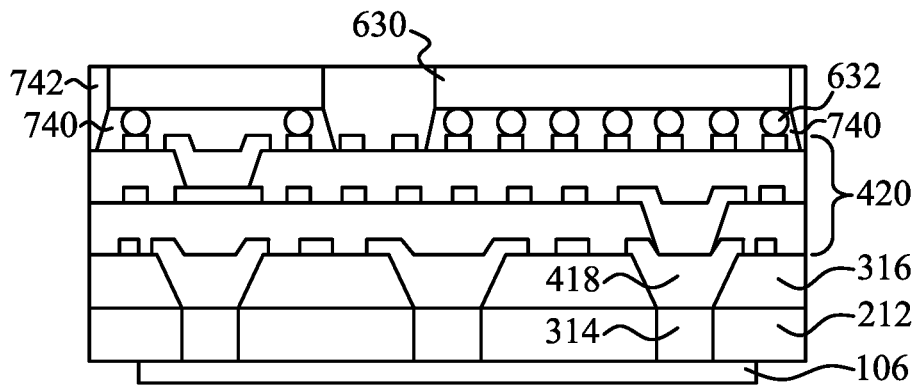

After the die attach process, an optional molding underfill 740 may be placed between the integrated circuit dies 630 and the uppermost RDL 420, as illustrated in FIG. 7. The molding underfill 740 may be a liquid epoxy, deformable gel, silicon rubber, a combination thereof, and/or the like dispensed using acceptable dispensing equipment.

Additionally, a molding compound 742, or encapsulant, may be applied. In an embodiment, the molding compound 742 is a polymer, although it may also be formed of other materials such as molding underfill (MUF), epoxy, or the like. Molding compound 742 may be in contact with the top surface and the edges of integrated circuit dies 630, and in contact with the top surface of RDLs 420. The molding compound 742 may be molded using, for example, compressive molding or transfer molding. Top surface of molding compound 742 may be higher than top surface of integrated circuit dies 630, and integrated circuit dies 630 may be fully encapsulated in molding compound 742. Optionally, a grinding processed may be performed to remove the portions of molding compound 742, which portions are over top surface of integrated circuit dies 630, thereby exposing a top surface of the integrated circuit dies 630. Exposing a top surface of the integrated circuit dies 630 may be desirable when, for example, attaching a heat sink to the integrated circuit dies 630.

A second trim process, e.g., a singulation process, may also be performed. The processes discussed above are illustrated by a portion of a larger wafer (panel/substrate). As such, a second trim process using a die saw, laser, or other mechanism to separate the integrated circuit dies 630 to create separate packages may be used. FIG. 7 represents package after a second trim process or singulation process.

Figure 8:
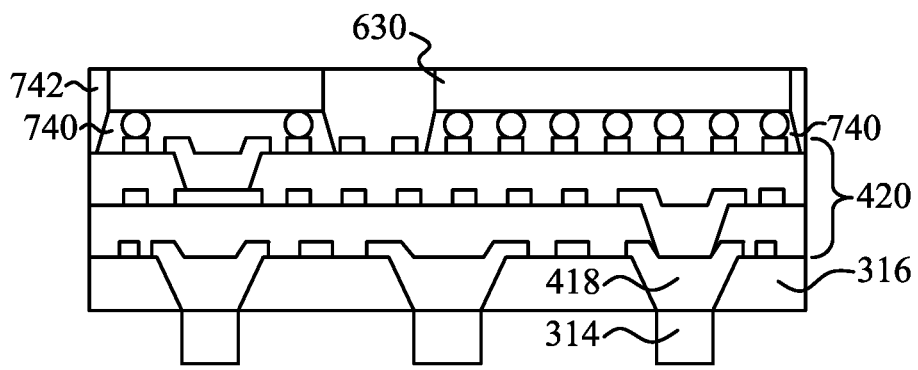

FIG. 8 illustrates removal of the conductive foil 106 and the sacrificial layer 212, thereby exposing the pillars 314, in accordance with an embodiment. In an embodiment in which the conductive foil 106 is a copper layer, the removal process may be performed using, for example, a wet dip in a chemical solution of phosphoric acid ($H_3PO_4$) and hydrogen peroxide ($H_2O_2$), referred to as DPP, with 2% hydrofluoric (HF) acid, or another cleaning process. In an embodiment in which the sacrificial layer 212 is formed of a polymer, the removal process may be performed using, for example, a wet strip process.

Figure 9:
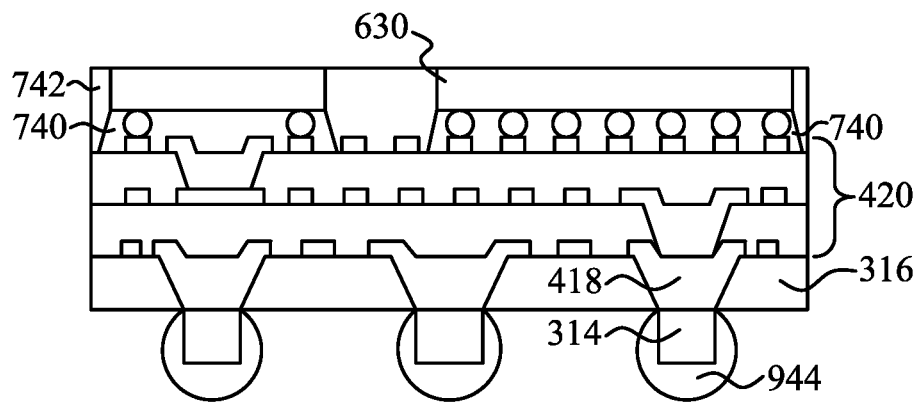

FIG. 9 illustrates the structure after placing solder balls 944 on the pillars 314 in accordance with an embodiment. The solder balls 944 are formed on the pillars 314 by printing, electro-plating, and/or the like, and may comprise copper, tin, eutectic solder, lead free solder, nickel, a combination thereof, and/or the like. A subsequent reflow process may be performed in which the solder balls 944 are melted, forming solder balls as illustrated in FIG. 9. In this embodiment, the solder extends along sidewalls of the pillars 314.

Figure 10:
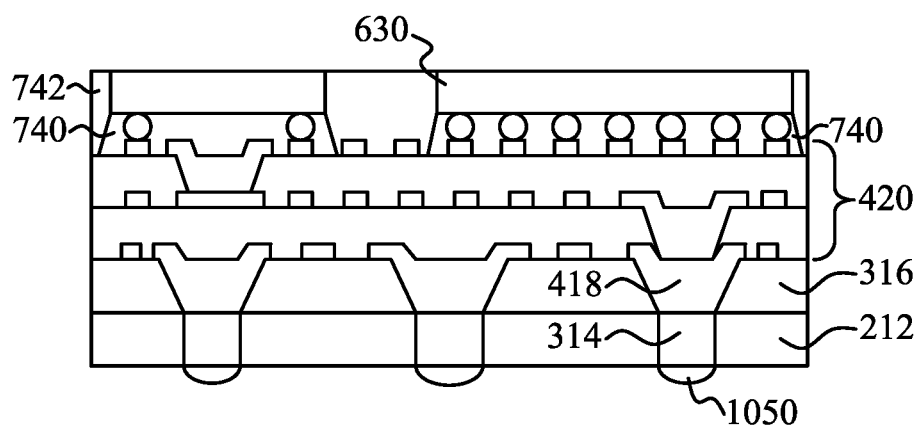
FIGS. 10-11 are cross-sectional views of intermediate stages in the manufacturing of a package in accordance with various other embodiments.
Figure 11:
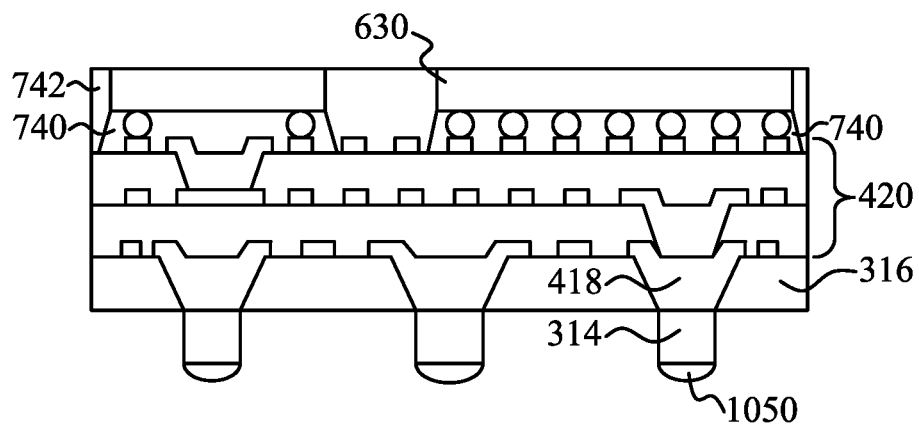

FIGS. 10 and 11 illustrate another embodiment. In this embodiment, the processes discussed above with reference to FIGS. 1-7 are performed, after which the conductive foil 106 may be removed as illustrated in FIG. 10. Comparing to the embodiment illustrated in FIG. 8, wherein the conductive foil 106 and the sacrificial layer 212 are removed, FIG. 10 illustrates an embodiment in which the conductive foil 106 is removed, but the sacrificial layer 212 remains. In this embodiment, top surfaces of the pillars 314 are exposed.

In an embodiment in which the conductive foil 106 is a copper layer, the removal process may be performed using, for example, a wet dip in a chemical solution of phosphoric acid ($H_3PO_4$) and hydrogen peroxide ($H_2O_2$), referred to as DPP, with 2% hydrofluoric (HF) acid, or another cleaning process.

Also illustrated in FIG. 10 is a solder ball 1050 placement. The solder balls 1050 are formed on the pillars 314 by printing, electro-plating, and/or the like, and may comprise copper, tin, eutectic solder, lead free solder, nickel, a combination thereof, and/or the like. A subsequent reflow process may be performed in which the solder balls 1050 are melted, forming solder balls as illustrated in FIG. 10.

Thereafter, as illustrated in FIG. 11, the sacrificial layer 212 is removed. In an embodiment in which the sacrificial layer 212 is formed of a polymer, the removal process may be performed using, for example, a wet strip process.

Figure 12:
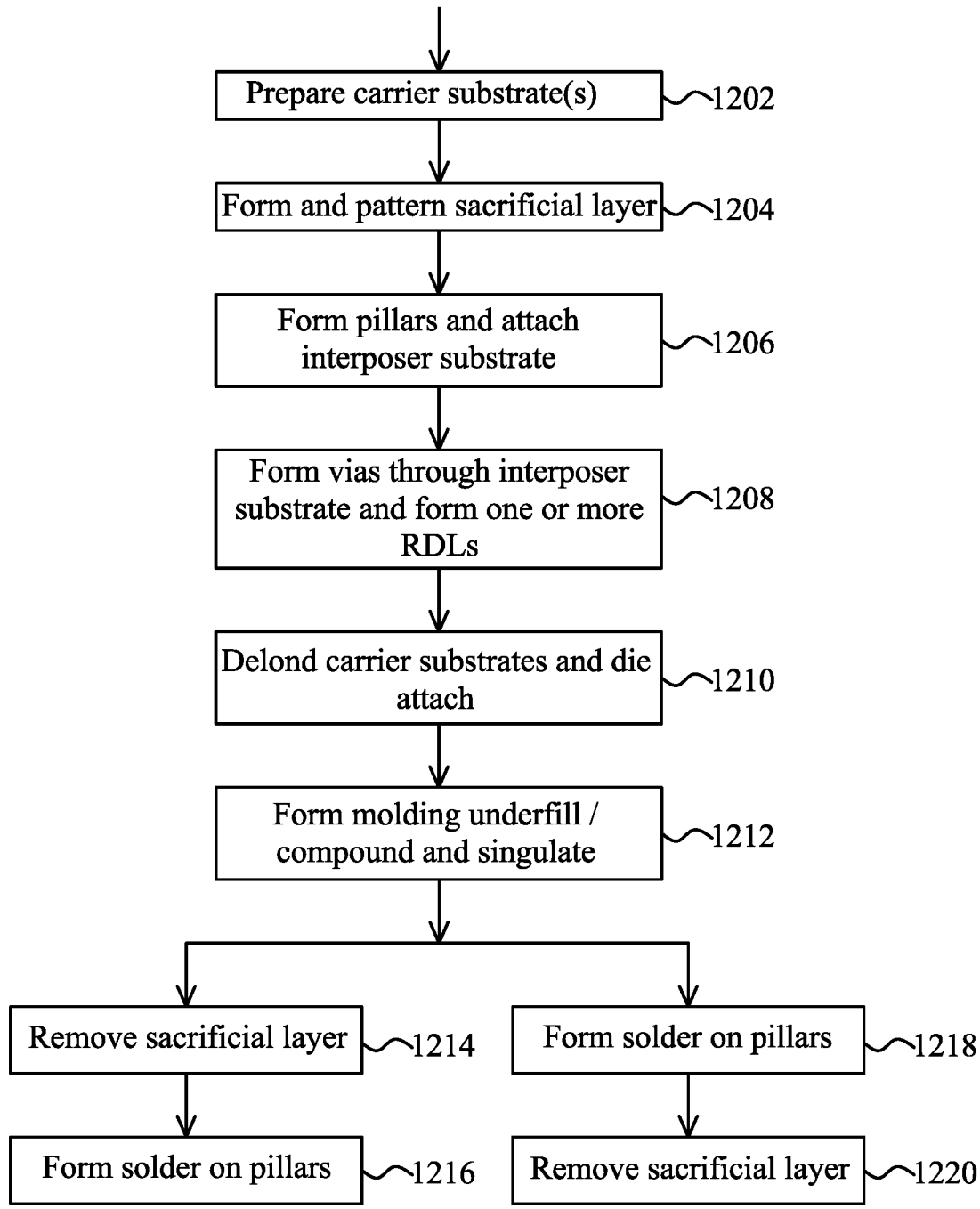
FIG. 12 is a flow chart of a method that may be used in accordance with some embodiments.

FIG. 12 is a flow chart of a process that may be used as described above with reference to FIGS. 1-9. The process begins in step 1202, wherein carrier substrates are prepared. For example, in an embodiment two carrier substrates are optionally bonded together, a coating layer such as a pre-preg layer is formed over the bonded carrier substrates, and a conductive layer or foil is placed on the coating layer, such as discussed above with reference to FIG. 1. Next, in step 1204, a sacrificial layer is formed and patterned over the conductive layer such that openings are formed to expose portions of the conductive layer, such as discussed above with reference to FIG. 2. In step 1206, conductive pillars are formed in the openings and substrates, such as interposer substrates, are placed over the sacrificial layer, such as discussed above with reference to FIG. 3. In step 1208, through vias are formed through the interposer substrate and one or more RDLs are formed over the interposer substrate, as discussed above with reference to FIGS. 4 and 5. Next, in step 1210, integrated circuit dies are electrically coupled to the RDLs and the carrier substrates are debonded, as discussed above with reference to FIG. 6. A molding underfill and a singulation process is performed in step 1212, as discussed above with reference to FIG. 7. In step 1214, the conductive foil and the sacrificial layer are removed as discussed above with reference to FIG. 8, and in step 1216 solder may be placed on the exposed pillars as discussed above with reference to FIG. 9.

Step 1218 illustrates an optional method in which solder is placed on the pillars prior to removing the sacrificial layer as discussed above with reference to FIG. 10. Thereafter, in step 1220, the sacrificial layer is removed as discussed above with reference to FIG. 11.

Embodiments such as those discussed above may reduce the form factor. For example, in situations using an interposer, such as a silicon interposer, the interposer processed first and then placed on a printed circuit board due to stress. The total form factor for this type of configuration can be relatively high. The use of the interposer structure described herein, such as the polymer interposer, it is possible to reduce the substrate process and cost, as well as the form factor.

Additionally, embodiments such as those disclosed above may reduce loss of known good dies (KGDs). For example, in a typical silicon interposer scenario, the silicon interposer is not tested until after exposure of the through vias along the backside of the silicon interposer, which exposure typically occurs after attachment of the KGDs. Thus, if an error occurs during the formation of the through vias or RDLs on the silicon interposer, the KGDs may be wasted. In embodiments such as those discussed above, the through vias and the RDLs may be electrically tested prior to attachment of the KGDs. Thus, if an error occurs in the formation of the interposer as discussed herein, the KGDs are not wasted.

Furthermore, embodiments such as those disclosed above may reduce device leakage. For example, the distance between through vias in a silicon interposer are generally very small and silicon can be rather leaky itself. As a result, silicon interposers may utilize expensive passivation processes to reduce device leakage between vias. In embodiments such as those disclosed above, the via distance may be relatively larger and the material of the interposer, (e.g., pre-peg, ABF, glass, or the like) are more isolative in terms of device leakage, thereby allowing some passivation processes to be skipped.

Some embodiments such as those disclosed above may also reduce warpage. For example, structures such as those disclosed above utilize thick and symmetrical dual-core structures, which can balance the warpage effect during most of processes (e.g. curing, sacrificial layer coating, plating, and the like). Additionally, one core substrate remains during the chip on wafer processing to support the structure.

In accordance with embodiments, a method is provided. The method includes forming a first dielectric layer over a substrate, and patterning a sacrificial layer over the first dielectric layer, the patterned sacrificial layer having openings formed therein. Conductive pillars are formed in the openings, and a second substrate if provided over the patterned sacrificial layer. Through vias are formed in the second substrate and one or more integrated circuit dies are electrically coupled to the conductive pillars, the integrated circuit dies being coupled to a side of the second substrate opposite the pillars.

In accordance with other embodiments, another method is provided. The method includes providing a first carrier substrate bonded to a second carrier substrate, and forming a first sacrificial layer and a second sacrificial layer over the first carrier substrate and the second carrier substrate, respectively. The sacrificial layers are patterned to form openings and the openings are filled with a conductive material to form pillars. A first interposer substrate and a second interposer substrate is provided over the first sacrificial layer and the second sacrificial layer, respectively, and through vias and second through vias are formed in the first interposer substrate and the second interposer substrate, respectively. The first carrier substrate and the second carrier substrate may be debonded.

In accordance with yet other embodiments, a semiconductor device is provided. The semiconductor device includes an interposer having a plurality of through vias extending through the interposer, wherein the interposer comprises pre-peg, Ajinimoto buildup film (ABF), or glass. One or more redistribution layers extend over a first surface of the interposer, and conductive pillars extending from a second surface of the interposer.

In yet another embodiment, a method is provided. The method includes forming a patterned sacrificial layer over a first substrate, the patterned sacrificial layer having openings formed therein, after forming the patterned sacrificial layer, forming conductive pillars in the openings of the patterned sacrificial layer, and after forming the conductive pillars, electrically coupling one or more integrated circuit dies to the conductive pillars. After electrically coupling the one or more integrated circuit dies to the conductive pillars, the patterned sacrificial layer is removed to expose sidewalls of the conductive pillars.

In yet another embodiment, a method is provided. The method includes forming a first layer over a first surface of a first substrate, forming a second layer over the first layer, forming a first opening in the second layer, after forming the second layer, forming a conductive element in the first opening. The method further includes attaching a second substrate to the second layer such that the second layer is interposed between the second substrate and the first substrate, after attaching the second substrate, forming an electrical connection through the second substrate to the conductive element, and electrically coupling one or more integrated circuit dies to the conductive element, the integrated circuit dies being coupled to a side of the second substrate opposite the conductive element. The first substrate is removed, and the first layer is removed, thereby exposing sidewalls of the conductive element.

In yet another embodiment, a method is provided. The method includes forming a first sacrificial layer on a first carrier substrate and a second sacrificial layer on a second carrier substrate, the first carrier substrate being bonded to the second carrier substrate, the first carrier substrate and the second carrier substrate being interposed between the first sacrificial layer and the second sacrificial layer. The method further includes patterning the first sacrificial layer to form first openings and the second sacrificial layer to form second openings, filling the first openings and the second openings with a conductive material, thereby forming first pillars and second pillars, respectively, attaching a first interposer substrate on the first sacrificial layer and a second interposer substrate on the second sacrificial layer, and forming first through vias through the first interposer substrate to respective ones of the first pillars and second through vias through the second interposer substrate to respective ones of the second pillars. The first carrier substrate and the second carrier substrate are separated, and after the separating, removing the first sacrificial layer to expose sidewalls of the first pillars.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A semiconductor device comprising:
   an integrated circuit die;
   an interconnect structure, the integrated circuit die being coupled to the interconnect structure, the interconnect structure comprising:
   a first insulating layer;
   a second insulating layer, the first insulating layer being interposed between the second insulating layer and the integrated circuit die;
   a first conductive feature extending through the first insulating layer, the first conductive feature having a first width at a first surface of the first insulating layer and a second width at a second surface of the first insulating layer, wherein the second width of the first conductive feature is less than the first width of the first conductive feature, the first surface of the first insulating layer being closer to the integrated circuit die than the second surface of the first insulating layer, the first conductive feature extending over the first surface of first insulating layer; and
   a second conductive feature extending through the second insulating layer, the second conductive feature having a first width at a first surface of the second insulating layer and a second width at a second surface of the second insulating layer, wherein the second width of the second conductive feature is less than the first width of the second conductive feature, the first surface of the second insulating layer being closer to the integrated circuit die than the second surface of the second insulating layer, the first insulating layer comprising a single insulating layer extending along sidewalls of the first conductive feature and extending along a sidewall of the second conductive feature; and a conductive pillar attached directly to the second conductive feature, wherein the entirety of a top surface of the conductive pillar is in physical contact with a bottom surface of the second conductive feature.

2. The semiconductor device of claim 1, wherein the first insulating layer is formed of a different material than the second insulating layer.

3. The semiconductor device of claim 1, wherein the integrated circuit die is coupled to the interconnect structure by solder.

4. The semiconductor device of claim 1, wherein a thickness of the conductive pillar is 30 µm to 70 µm.

5. The semiconductor device of claim 1, wherein sidewalls of the conductive pillar are perpendicular to the second surface of the second insulating layer.

6. The semiconductor device of claim 1, wherein the first conductive feature is directly under the integrated circuit die.

7. The semiconductor device of claim 6, further comprising an underfill interposed between the first conductive feature and the integrated circuit die.

8. The semiconductor device of claim 1, further comprising solder on the conductive pillar, wherein the solder extends along a sidewall of the conductive pillar.

9. A semiconductor device comprising:
an interconnect structure, the interconnect structure having a first surface and a second surface opposite the first surface, the first surface being planar, the first surface of the interconnect structure comprising a surface of a first insulating layer and a surface of a first via extending through the first insulating layer, the first via having continuously tapered sidewalls such that a width of the first via at the first surface of the interconnect structure is less than a width of the first via at a first surface of the first insulating layer;
a conductive pillar directly on the first via at the first surface of the interconnect structure, wherein a width of the conductive pillar is equal to the width of the first via at the first surface of the interconnect structure;
solder on the conductive pillar, the solder extending along sidewalls of the conductive pillar, wherein the solder extends to the first surface of the interconnect structure; and
an integrated circuit die mounted on the second surface of the interconnect structure.

10. The semiconductor device of claim 9, wherein the integrated circuit die is mounted on the second surface of the interconnect structure using solder.

11. The semiconductor device of claim 9, wherein sidewalls of the conductive pillar are perpendicular to the first surface of the interconnect structure.

12. The semiconductor device of claim 9, wherein a portion of the first via extends over the first surface of the first insulating layer.

13. The semiconductor device of claim 9 further comprising an underfill interposed between the integrated circuit die and the interconnect structure.

14. A semiconductor device comprising:
a first insulating layer having a first via;
a conductive pillar directly coupled to the first via, a width of the first via increasing as the first via extends away from the conductive pillar, wherein a slope of sidewalls of the first via are different than sidewalls of the conductive pillar;
a second insulating layer directly contacting the first insulating layer, the second insulating layer having a second via, the second via directly contacting the first via, a width of the second via increasing as the second via extends away from the first insulating layer, wherein a bottommost surface of the second via is lower than a topmost surface of the first via;
a third insulating layer over the second insulating layer, wherein the second insulating layer is interposed between the third insulating layer and the first insulating layer;
conductive interconnects along a surface of the third insulating layer; and
an integrated circuit die bonded to the conductive interconnects.

15. The semiconductor device of claim 14, wherein the integrated circuit die extends over the second via.

16. The semiconductor device of claim 14, wherein the first insulating layer and the second insulating layer comprises different materials.

17. The semiconductor device of claim 16, wherein the first insulating layer comprises pre-peg laminated material or buildup film.

18. The semiconductor device of claim 14, further comprising solder on the conductive pillar.

19. The semiconductor device of claim 14, wherein the integrated circuit die is bonded to the conductive interconnects using solder.

20. The semiconductor device of claim 14, wherein the second via extends over a top surface of the second insulating layer.

* * * * *